(12) United States Patent
Cooper et al.

(10) Patent No.: US 9,765,288 B2
(45) Date of Patent: Sep. 19, 2017

(54) COMPOSITIONS FOR CLEANING III-V SEMICONDUCTOR MATERIALS AND METHODS OF USING SAME

(71) Applicants: ENTEGRIS, INC., Billerica, MA (US); ATMI TAIWAN CO., LTD, Hsinchu (TW)

(72) Inventors: Emanuel I. Cooper, Scarsdale, NY (US); Hsing-Chen Wu, Yonghe (TW); Min-Chieh Yang, Yonghe (TW); Sheng-Hung Tu, Yonghe (TW); Li-Min Chen, Norwalk, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/648,815

(22) PCT Filed: Dec. 4, 2013

(86) PCT No.: PCT/US2013/073096
§ 371 (c)(1),
(2) Date: Jun. 1, 2015

(87) PCT Pub. No.: WO2014/089196
PCT Pub. Date: Jun. 12, 2014

(65) Prior Publication Data
US 2015/0344825 A1  Dec. 3, 2015

Related U.S. Application Data

(60) Provisional application No. 61/733,726, filed on Dec. 5, 2012.

(51) Int. Cl.
| | | |
|---|---|---|
| C11D 7/04 | (2006.01) | |
| C11D 7/26 | (2006.01) | |
| C11D 7/32 | (2006.01) | |
| C11D 3/00 | (2006.01) | |
| C11D 7/08 | (2006.01) | |
| C11D 11/00 | (2006.01) | |

(52) U.S. Cl.
CPC ............. *C11D 7/04* (2013.01); *C11D 3/0073* (2013.01); *C11D 7/08* (2013.01); *C11D 7/26* (2013.01); *C11D 7/265* (2013.01); *C11D 7/3209* (2013.01); *C11D 7/3281* (2013.01); *C11D 11/0047* (2013.01)

(58) Field of Classification Search
CPC .................................................. C11D 11/0047
See application file for complete search history.

(56) References Cited

U.S. PATENT DOCUMENTS

| | | | |
|---|---|---|---|
| 4,873,136 A * | 10/1989 | Foust ...................... | C23C 18/22 205/126 |
| 5,320,709 A | 6/1994 | Bowden | |
| 5,702,075 A | 12/1997 | Lehrman | |
| 5,976,928 A | 11/1999 | Kirlin et al. | |
| 5,993,685 A | 11/1999 | Currie et al. | |
| 6,194,366 B1 | 2/2001 | Naghshineh et al. | |
| 6,211,126 B1 | 4/2001 | Wojtczak et al. | |
| 6,224,785 B1 | 5/2001 | Wojtczak et al. | |
| 6,280,651 B1 | 8/2001 | Wojtczak et al. | |
| 6,306,807 B1 | 10/2001 | Wojtczak et al. | |
| 6,322,600 B1 | 11/2001 | Brewer et al. | |
| 6,323,168 B1 | 11/2001 | Kloffenstein et al. | |
| 6,344,432 B1 | 2/2002 | Wojtczak et al. | |
| 6,346,741 B1 | 2/2002 | Van Buskirk et al. | |
| 6,395,194 B1 | 5/2002 | Russell et al. | |
| 6,409,781 B1 | 6/2002 | Wojtczak et al. | |
| 6,465,403 B1 * | 10/2002 | Skee ................... | C11D 3/0073 134/3 |
| 6,492,308 B1 | 12/2002 | Naghshineh et al. | |
| 6,527,819 B2 | 3/2003 | Wojtczak et al. | |
| 6,566,315 B2 | 5/2003 | Wojtczak et al. | |
| 6,627,587 B2 | 9/2003 | Naghshineh et al. | |
| 6,723,691 B2 | 4/2004 | Naghshineh et al. | |
| 6,735,978 B1 | 5/2004 | Tom et al. | |
| 6,755,989 B2 | 6/2004 | Wojtczak et al. | |
| 6,773,873 B2 | 8/2004 | Seijo et al. | |
| 6,800,218 B2 | 10/2004 | Ma et al. | |
| 6,802,983 B2 | 10/2004 | Mullee et al. | |
| 6,849,200 B2 | 2/2005 | Baum et al. | |
| 6,875,733 B1 | 4/2005 | Wojtczak | |
| 6,896,826 B2 | 5/2005 | Wojtczak et al. | |
| 6,943,139 B2 | 9/2005 | Korzenski et al. | |
| 6,989,358 B2 | 1/2006 | Korzenski et al. | |
| 7,011,716 B2 | 3/2006 | Xu et al. | |
| 7,029,373 B2 | 4/2006 | Ma et al. | |
| 7,030,168 B2 | 4/2006 | Xu et al. | |
| 7,119,052 B2 | 10/2006 | Korzenski et al. | |

(Continued)

FOREIGN PATENT DOCUMENTS

| | | |
|---|---|---|
| JP | 2011159658 A | 8/2011 |
| JP | 2012036750 A | 2/2012 |
| JP | 2012062572 A | 3/2012 |
| JP | 2012186470 A | 9/2012 |
| JP | 2012251026 A | 12/2012 |
| WO | 2006110645 A1 | 10/2006 |
| WO | 2006127885 A1 | 11/2006 |
| WO | 2007027522 A1 | 3/2007 |
| WO | 2008036823 A2 | 3/2008 |
| WO | 2008144501 A2 | 11/2008 |

(Continued)

OTHER PUBLICATIONS

International Search Report, Mar. 26, 2014.

(Continued)

*Primary Examiner* — Gregory Webb

(57) ABSTRACT

Liquid compositions useful for the cleaning of residue and contaminants from a III-V microelectronic device material, such as InGaAs, without substantially removing the III-V material. The liquid compositions are improvements of the SC1 and SC2 formulations.

19 Claims, No Drawings

(56) References Cited

U.S. PATENT DOCUMENTS

| | | | |
|---|---|---|---|
| 7,119,418 B2 | 10/2006 | Xu et al. | |
| 7,160,815 B2 | 1/2007 | Korzenski et al. | |
| 7,223,352 B2 | 5/2007 | Korzenski et al. | |
| 7,273,060 B2* | 9/2007 | Patel | C11D 3/0094 134/1.3 |
| 7,300,601 B2 | 11/2007 | Liu et al. | |
| 7,326,673 B2 | 2/2008 | Xu et al. | |
| 7,335,239 B2 | 2/2008 | Baum | |
| 7,361,603 B2 | 4/2008 | Liu et al. | |
| 7,365,045 B2 | 4/2008 | Walker et al. | |
| 7,485,611 B2 | 2/2009 | Roeder et al. | |
| 7,534,752 B2 | 5/2009 | Wojtczak et al. | |
| 7,553,803 B2 | 6/2009 | Korzenski et al. | |
| 7,557,073 B2 | 7/2009 | Korzenski et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,923,423 B2 | 4/2011 | Walker et al. | |
| 7,960,328 B2 | 6/2011 | Visintin et al. | |
| 8,026,200 B2 | 9/2011 | Cooper et al. | |
| 8,058,219 B2 | 11/2011 | Rath et al. | |
| 8,114,220 B2 | 2/2012 | Visintin et al. | |
| 8,178,585 B2 | 5/2012 | Petruska et al. | |
| 8,236,485 B2 | 8/2012 | Minsek et al. | |
| 8,304,344 B2 | 11/2012 | Boggs et al. | |
| 8,338,087 B2 | 12/2012 | Rath et al. | |
| 8,367,555 B2 | 2/2013 | Afzali-Ardakani et al. | |
| 8,618,036 B2 | 12/2013 | Afzali-Ardakani et al. | |
| 8,685,909 B2 | 4/2014 | Angst et al. | |
| 8,754,021 B2 | 6/2014 | Barnes et al. | |
| 8,778,210 B2 | 7/2014 | Cooper et al. | |
| 8,951,948 B2 | 2/2015 | Rath et al. | |
| 9,045,717 B2 | 6/2015 | Nakanishi et al. | |
| 9,063,431 B2 | 6/2015 | Barnes et al. | |
| 9,074,169 B2 | 7/2015 | Chen et al. | |
| 9,074,170 B2 | 7/2015 | Barnes et al. | |
| 9,175,404 B2 | 11/2015 | Kojima et al. | |
| 9,215,813 B2 | 12/2015 | Brosseau et al. | |
| 2004/0038840 A1* | 2/2004 | Lee | C11D 3/0073 510/202 |
| 2004/0134873 A1* | 7/2004 | Yao | C09G 1/02 216/2 |
| 2005/0118832 A1 | 6/2005 | Korzenski et al. | |
| 2005/0145311 A1 | 7/2005 | Walker et al. | |
| 2005/0176603 A1 | 8/2005 | Hsu | |
| 2005/0227482 A1 | 10/2005 | Korzenski et al. | |
| 2005/0263490 A1 | 12/2005 | Liu et al. | |
| 2006/0019850 A1 | 1/2006 | Korzenski et al. | |
| 2006/0063687 A1 | 3/2006 | Minsek et al. | |
| 2006/0148666 A1 | 7/2006 | Peters et al. | |
| 2006/0154186 A1 | 7/2006 | Minsek et al. | |
| 2006/0249482 A1 | 11/2006 | Wrschka et al. | |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0261847 A1* | 10/2008 | Visintin | H01L 21/02079 510/176 |
| 2008/0271991 A1 | 11/2008 | Korzenski et al. | |
| 2009/0032766 A1 | 2/2009 | Rajaratnam et al. | |
| 2009/0120457 A1* | 5/2009 | Naghshineh | C11D 3/3947 134/2 |
| 2009/0192065 A1 | 7/2009 | Korzenski et al. | |
| 2009/0212021 A1* | 8/2009 | Bernhard | C23F 1/28 216/109 |
| 2009/0215269 A1 | 8/2009 | Boggs et al. | |
| 2009/0239777 A1 | 9/2009 | Angst et al. | |
| 2009/0253072 A1 | 10/2009 | Petruska et al. | |
| 2009/0301996 A1 | 12/2009 | Visintin et al. | |
| 2010/0056410 A1 | 3/2010 | Visintin et al. | |
| 2010/0065530 A1 | 3/2010 | Walker et al. | |
| 2010/0087065 A1 | 4/2010 | Boggs et al. | |
| 2010/0112728 A1* | 5/2010 | Korzenski | H01L 21/02079 438/3 |
| 2010/0163788 A1 | 7/2010 | Visintin et al. | |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0117751 A1 | 5/2011 | Sonthalia et al. | |
| 2012/0083436 A1 | 4/2012 | Lee | |
| 2012/0273010 A1* | 11/2012 | Duong | C11D 7/263 134/26 |
| 2012/0283163 A1 | 11/2012 | Barnes et al. | |
| 2013/0078756 A1* | 3/2013 | Ferstl | C11D 7/3209 438/71 |
| 2013/0270217 A1 | 10/2013 | Yoshida et al. | |
| 2013/0280123 A1 | 10/2013 | Chen et al. | |
| 2013/0295712 A1 | 11/2013 | Chen et al. | |
| 2013/0296214 A1* | 11/2013 | Barnes | H01L 21/02063 510/176 |
| 2013/0303420 A1 | 11/2013 | Cooper et al. | |
| 2013/0336857 A1 | 12/2013 | Korzenski et al. | |
| 2014/0038420 A1 | 2/2014 | Chen et al. | |
| 2014/0128307 A1* | 5/2014 | Chhabra | C11D 3/042 510/175 |
| 2014/0191019 A1 | 7/2014 | Chen et al. | |
| 2014/0306162 A1 | 10/2014 | Poe et al. | |
| 2014/0318584 A1 | 10/2014 | Cooper et al. | |
| 2014/0319423 A1 | 10/2014 | Cooper | |
| 2015/0027978 A1 | 1/2015 | Barnes et al. | |
| 2015/0045277 A1 | 2/2015 | Liu et al. | |
| 2015/0050199 A1 | 2/2015 | Korzenski et al. | |
| 2015/0075570 A1 | 3/2015 | Wu et al. | |
| 2015/0114429 A1 | 4/2015 | Jenq et al. | |
| 2015/0162213 A1 | 6/2015 | Chen et al. | |
| 2015/0168843 A1 | 6/2015 | Cooper et al. | |
| 2016/0130500 A1* | 5/2016 | Chen | C11D 3/30 216/13 |

FOREIGN PATENT DOCUMENTS

| | | |
|---|---|---|
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012051380 A2 | 5/2012 |
| WO | 2012154498 A2 | 11/2012 |
| WO | 2012174518 A2 | 12/2012 |
| WO | 2013058770 A1 | 4/2013 |
| WO | 2013123317 A1 | 8/2013 |
| WO | 2013138278 A1 | 9/2013 |

OTHER PUBLICATIONS

Sun, Yun, et al., "Arsenic-dominated chemistry in the acid cleaning of InGaAs and InAlAs surfaces," Applied Physics Letters, 2008, pp. 1-9.

* cited by examiner

# COMPOSITIONS FOR CLEANING III-V SEMICONDUCTOR MATERIALS AND METHODS OF USING SAME

CROSS-REFERENCE TO RELATED APPLICATIONS

This application is filed under the provisions of 35 U.S.C. §371 and claims the priority of International Patent Application No. PCT/US2013/073096 filed on 4 Dec. 2013 entitled "COMPOSITIONS FOR CLEANING III-V SEMICONDUCTOR MATERIALS AND METHODS OF USING SAME" in the name of Emanuel I. COOPER, et al., which claims priority to U.S. Provisional Patent Application No. 61/733,726 filed on 5 Dec. 2012, both of which are hereby incorporated by reference herein in their entirety.

FIELD

The present invention generally relates to a composition and method for cleaning the surface of a III-V microelectronic surface, and more particularly, to such a process utilizing the composition incorporated in a microelectronic device manufacturing process.

DESCRIPTION OF THE RELATED ART

Over the past several years, numerous materials have been introduced for use in advanced CMOS processes to continue scaling and increase device performance. Among these materials are high-electron-mobility III-V compounds, which can be used as substrates for CMOS technology and/or as channel material for metal-oxide-semiconductor devices. When used as substrates for high performance devices, the III-V materials have to be compliant with the strict metal contamination specifications or requirements of a semiconductor manufacturing facility. Meeting these specifications or requirements is a challenge for the cleaning and the etching techniques employed, especially because the surface roughness of the cleaned substrate should not be affected.

In order to clean bulk III-V material, a thick layer of III-V material surface needs to be removed, e.g., by etching, without metal re-plating occurring on the bare, e.g., etched, surface afterwards. Re-plating is a phenomenon that may occur because noble metals like Cu and Au have high oxidation potentials and are able to oxidize the III-V material. As a result, re-deposition of these noble metals from the cleaning solutions onto the III-V material, also known as re-plating, can occur through a redox reaction. This behavior makes the noble metals very hard to remove with standard chemistries.

The prior art relating to the cleaning of III-V material deals with bulk etching (micron scale), however, little is known about how to efficaciously clean III-V materials having only nanometer thickness. Preferably, a composition should clean the thin III-V materials such that residues, particles and trace metals are removed, as well as native oxides and bulk organic materials (e.g., resist). Further, the composition should not substantially etch the thin III-V material and there should be no substantial change in the stoichiometry of the III-V material. Accordingly, there are continuing efforts to find a composition and method for that effectively cleans the thin III-V material consistent with these performance goals. It would be further desirable if such a method were readily integratable into existing semiconductor processing designs. It would also be desired for the method to utilize a wet chemistry and be lower in cost than existing cleaning technologies such as annealing.

SUMMARY OF THE INVENTION

The present invention generally relates to a composition and method for cleaning III-V microelectronic device material, and more particularly, to such a process utilizing the composition incorporated in a microelectronic device manufacturing process. The surface of the III-V material is preferably cleaned of residue, e.g., post-ash residue, and other contaminants, such as particles, trace metals, and bulk organics, without substantial removal of the III-V material.

In one aspect, a liquid composition for cleaning the surface of a III-V microelectronic device material is described, said composition comprising at least one acid, at least one oxidizing agent, and water, with the proviso that (a) the at least one oxidizing agent comprises an oxidant that is milder than hydrogen peroxide, (b) the liquid composition further comprises at least one corrosion inhibitor, or (c) both (a) and (b).

In another aspect, a liquid composition for cleaning the surface of a III-V microelectronic device material is described, said composition comprising at least one base, at least one oxidizing agent, and water, with the proviso that (a) the at least one oxidizing agent comprises an oxidant that is milder than hydrogen peroxide, (b) the liquid composition comprises a base other than ammonium hydroxide, or (c) both (a) and (b).

In still another aspect, a method of cleaning a surface of a III-V microelectronic device material is described, said method comprising contacting the surface with a liquid composition comprising at least one acid, at least one oxidizing agent, and water, with the proviso that (a) the at least one oxidizing agent comprises an oxidant that is milder than hydrogen peroxide, (b) the liquid composition further comprises at least one corrosion inhibitor, or (c) both (a) and (b).

In yet another aspect, a method of cleaning a surface of a III-V microelectronic device material is described, said method comprising contacting the surface with a liquid composition for cleaning the surface of a III-V microelectronic device material is described, said composition comprising at least one base, at least one oxidizing agent, and water, with the proviso that (a) the at least one oxidizing agent comprises an oxidant that is milder than hydrogen peroxide, (b) the liquid composition comprises a base other than ammonium hydroxide, or (c) both (a) and (b).

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions and processes for cleaning the surface of a III-V material during microelectronic device manufacturing. Preferably, the liquid compositions described herein substantially remove post-ash residue material and contaminants from the surface of the III-V materials without substantially removing the III-V materials. For example, preferably the etch rate of the III-V material is less than about 25 Å, more preferably less than 10 Å, and most preferably less than 1 Å.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

The "III-V materials" include, but are not limited to, InP, InAs, GaAs, AsP, InGaAs, InGaAsP, GaP, GaSb, InSb, AlAs, AlGaAs, InAlAs, InAlGaAs, InAlGaP, and InGaP. They may be present as a substrate or a layer, e.g., channel material, on the microelectronic device.

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt.%.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

As is known by the person skilled in the chemical arts, ammonia ($NH_3$) and ammonium hydroxide ($NH_4OH$) are synonymous.

As used herein, "suitability" for cleaning the III-V material corresponds to at least partial removal of residue and contaminants from the surface of the III-V material, while not substantially removing the III-V material. Preferably, at least about 90 wt % of residue and contaminants, more preferably at least 95 wt % of residue and contaminants, and most preferably at least 99 wt % of residue and contaminantsto be removed are removed from the surface of the III-V material while the etch rate of the III-V material is less than about 25 Å, more preferably less than 10 Å, and most preferably less than 1 Å.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The standard clean solutions, such as SC1 and SC2, have been used to clean III-V materials with limited success. Disadvantageously, when using a standard SC1 or SC2 composition, metals present in residue are re-plated onto the III-V surface at the conclusion of the cleaning process. Further, the III-V material is removed in bulk by these clean solutions, which is not acceptable when the III-V material is only nanometers thick. In addition, the oxidizing agent in the standard clean solutions changes the stoichiometry of the III-V material. Improvements to the standard clean solutions are proposed herein, with the purpose of cleaning the III-V surface while minimizing or eliminating metal re-plating thus ensuring that the III-V surface is ready for subsequent deposition.

Conventionally, SC2 includes hydrochloric acid (HCl), hydrogen peroxide, and water. The improvement disclosed herein includes (a) the use of an oxidizing agent that is milder than hydrogen peroxide, and/or (b) the inclusion of corrosion inhibitors in the SC2 solution. As understood by the person skilled in the art, an oxidizing agent that is milder than hydrogen peroxide that etches metal at a rate slower than hydrogen peroxide does.

Accordingly, in a first aspect, a liquid composition for cleaning the surface of a III-V material is described, said composition including at least one acid, at least one oxidizing agent, and water. In one embodiment, the liquid composition comprises, consists of, or consists essentially of HCl, at least one oxidizing agent that is a milder oxidant than hydrogen peroxide, and water. In another embodiment, the liquid composition comprises, consists of, or consists essentially of HCl, at least one oxidizing agent that is a milder oxidant than hydrogen peroxide, at least one metal corrosion inhibitor, and water. In still another embodiment, the liquid composition comprises, consists of, or consists essentially of HCl, hydrogen peroxide, at least one metal corrosion inhibitor, and water. When the liquid composition of the first aspect includes a milder oxidant than hydrogen peroxide, the composition is substantially devoid of hydrogen peroxide. Preferably, the liquid compositions described herein substantially remove post-ash residue material and other contaminants while not substantially removing the III-V material from the microelectronic device.

The compositions described herein are substantially devoid of mineral abrasive materials, fluoride sources, polymeric materials, amines (primary amines, secondary amines, tertiary amines, amine-N-oxides) and combinations thereof. These compositions have pH value in a range from about 0 to about 4.

Oxidizing agents that are weaker oxidants than hydrogen peroxide and contemplated herein include, but are not limited to, nitric acid, perchloric acid, peroxyacetic acid, $FeCl_3$, oxone ($2KHSO_5 \cdot KHSO_4 \cdot K_2SO_4$), periodic acid, iodic acid, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, 1,4-benzoquinone, toluquinone, dimethyl-1,4-benzoquinone, chloranil, alloxan, N-methylmorpholine N-oxide (NMMO), trimethylamine N-oxide, pyridine-N-oxide, t-butyl-hydroperoxide, and combinations thereof. Most preferably, the oxidizing agents that are weaker oxidants than hydrogen peroxide include nitric acid, perchloric acid, and peracetic acid.

Metal corrosion inhibitors are added to minimize the oxidation of any exposed III-V layers or otherwise passivate the III-V material surface from oxidizing. Preferred metal corrosion inhibitors include sulfur-containing compounds and azole compounds such as triazole and derivatives thereof. Metal corrosion inhibitors contemplated herein include, but are not limited to, 1,2,4-triazole (TAZ), benzotriazole (BTA), tolyltriazole, 5-methyl-benzotriazole, 5-phenyl-benzotriazole, 5-nitro-benzotriazole, benzotriazole carboxylic acid, 3-amino-5-mercapto-1,2,4-triazole, 1-amino- 1,2,4-triazole, hydroxybenzotriazole, 2-(5-amino-pentyl)-benzotriazole, 1-amino-1,2,3-triazole, 4-phenyl-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, imidazole, 2-mercaptobenzimidazole (MBI), 4-methyl-2-phenylimidazole, 5-amino-1,3,4-thiadiazole-2-thiol (ATDT), 2-mercaptobenzothiazole, 2-mercaptothiazoline, 5-mercapto-4H-[1,2,4]triazol-3-ol, 4-ethyl-5-mercapto-4H-1,2,4-triazol-3-ol, 4-ethyl-4H-1,2,4-triazol-3-thiol, 5-ethyl-4H-1,2,4-triazol-3-thiol, (3-mercapto-5-propyl-4H-1,2,4-triazol-4-yl) acetic acid, 4-(5-sulfanyl-1H-tetraazol-1-yl)benzoic acid, 5-aminotetrazole, pentylenetetrazole, 5-phenyl-1H-tetrazole, 5-benzyl-1H-tetrazole, Ablumine O (Taiwan Surfactant), 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, indiazole, adenosine, carbazole, saccharin, benzoin oxime, DL-dithiothreitol (DTT), cystaminum dichloride, di-n-propyldisulfide, ammonium sulfide, ethyl thioglycolate, 2-mercaptoethanol, 1,2-ethanedithiol, cysteine, methionine, dibenzothiophene, S-adenosylmethionine, taurine, glutathione, thiolactic acid, mercaptosuccinic acid, thiosalicylic acid, 4-mercaptobenzoic acid, 2,2'-thiodiacetic acid, 3,3'-thiodipropionic acid, thioglycolic acid, dithiodiglycolic acid, 2,2'-(ethylenedithio)diacetic acid, ethyl 2-mercaptoacetate, 3-methoxybutyl thioglycolate, methyl thioglycolate, phosphonic acid, dodecylphosphonic acid (DDPA), benzylphosphonic acid, phenylphosphonic acid, and combinations thereof. Most preferably, the metal corrosion inhibitors comprise 2,2'-thiodiacetic acid, 3,3'-thiodipropionic acid, thioglycolic acid, dithiodiglycolic acid, 2,2'-(ethylenedithio) diacetic acid, ethyl 2-mercaptoacetate, 3-methoxybutyl thioglycolate, methyl thioglycolate, phosphonic acid, benzylphosphonic acid, phenylphosphonic acid, and combinations thereof.

The compositions of the first aspect are formulated in parts or weight percent ratios whereby the wt % of acid:wt % of oxidizing agent:wt % of water is 0.01-10:0.01-10:4-3000, more preferably 0.5-1.5:0.5-1.5:4-400, and most preferably 1:1:6-300. It should be appreciated that the liquid compositions can be made as a concentrate and diluted with additional water at the fab just prior to use. For example, the liquid compositions can be mixed to have a 1:1:5 acid:oxidizing agent:water ratio and mixed with additional water at the fab to yield a 1:1:300 acid:oxidizing agent:water ratio for cleaning. When corrosion inhibitor(s) are present, the wt % of acid:wt % of oxidizing agent:wt % of corrosion inhibitor:wt % of water is 0.01-10:0.01-10:0.01-10:4-3000, more preferably 0.5-1.5:0.5-1.5:0.5-1.5:4-400, and most preferably 1:1:1:6-300. It should be appreciated that the liquid compositions can be made as a concentrate and diluted with additional water at the fab just prior to use.

The cleaning of integrated circuit (IC) substrates, such as silicon wafers, with metal-free alkaline solutions to remove organic and metal contamination is widely practiced. One commonly used alkaline solution of this type is known as SC-1 or RCA-1, which comprises an aqueous mixture of ammonium hydroxide, hydrogen peroxide, and water (e.g., 1:1:5 of 30% $H_2O_2$, 28% $NH_4OH$ and $H_2O$). Various cleaning tasks can be accomplished with SC-1, among these, the cleaning of silicon wafers immediately after their fabrication, the cleaning of such wafers immediately prior to gate oxide growth, the removal of oxide etch residues later in the IC processing sequence, and selective etching and resist particulate removal. The purpose of the hydrogen peroxide is to protect the silicon metal from exposure to strong acids or bases by continuously forming a protective oxide layer in order to prevent etching or roughening of the silicon surface. Disadvantageously, hydrogen peroxide may corrode a metal on the surface of the substrate due to the metal reacting with oxygen of the hydrogen peroxide. The improvement disclosed herein includes (a) the use of an oxidizing agent that is milder than hydrogen peroxide, and/or (b) a base other than ammonium hydroxide in the SC1 solution.

Accordingly, in a second aspect, a liquid composition for cleaning the surface of a III-V material is described, said composition including at least one base, at least one oxidizing agent, and water. In one embodiment, the liquid composition comprises, consists of, or consists essentially of at least one base, at least one oxidizing agent that is a milder oxidant than hydrogen peroxide, and water. In another embodiment, the liquid composition comprises, consists of, or consists essentially of a base other than $NH_4OH$, at least one oxidizing agent that is a milder oxidant than hydrogen peroxide, and water. In yet another embodiment, the liquid composition comprises, consists of, or consists essentially of a base other than $NH_4OH$, at least one oxidizing agent, and water. In still another embodiment, the liquid composition comprises, consists of, or consists essentially of at least one base, at least one oxidizing agent that is a milder oxidant than hydrogen peroxide, at least one metal corrosion inhibitor, and water. In another embodiment, the liquid composition comprises, consists of, or consists essentially of a base other than $NH_4OH$, at least one oxidizing agent that is a milder oxidant than hydrogen peroxide, at least one metal corrosion inhibitor, and water. In yet another embodiment, the liquid composition comprises, consists of, or consists essentially of a base other than $NH_4OH$, at least one oxidizing agent, at least one metal corrosion inhibitor, and water. When the liquid composition of the second aspect includes a milder oxidant than hydrogen peroxide, the composition is substantially devoid of hydrogen peroxide. Preferably, the liquid compositions described herein substantially remove post-ash residue material and other contaminants while not substantially removing the III-V material from the microelectronic device.

The compositions of the second aspect described herein are substantially devoid of mineral abrasive materials, fluoride sources, polymeric materials, and combinations thereof. These compositions of the second aspect have pH value in a range from about 9 to about 14.

The at least one base other than $NH_4OH$ includes, but is not limited to, alkanolamines and quaternary ammonium hydroxides having the formula $R_1R_2R_3R_4NOH$ where $R_1$, $R_2$, $R_3$ and $R_4$ are the same as or different from one another and are hydrogen, $C_1$-$C_6$ alkyl groups (e.g., methyl, ethyl, propyl, butyl, pentyl or hexyl) and substituted or unsubstituted $C_6$-$C_{10}$ aryl groups (e.g,. benzyl). For example, the at least one base can include at least one species selected from the group consisting of monoethanolamine (MEA), diethanolamine, triethanolamine, dimethylamino ethanol, diethylamino ethanol, 2-amino-2-methyl-1-propanol, N-(aminoethyl)ethanolamine, N,N-dimethyl-2-amino ethanol, 2-(2-amino ethoxy) ethanol, tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), hydroxyamine, trimethylethylammonium hydroxide, diethyldimethylammonium hydroxide, and combinations thereof. Alternatively, or in addition to, the other bases can include choline hydroxide, tetrabutylphosphonium hydroxide, guanidine acetate, 1,1,3,3-tetramethylguanidine, guanidine carbonate, arginine, and combinations thereof.

Oxidizing agents that are weaker oxidants than hydrogen peroxide and contemplated herein include, but are not limited to, nitric acid, perchloric acid, peroxyacetic acid, $FeCl_3$, oxone ($2KHSO_5 \cdot KHSO_4 \cdot K_2SO_4$), periodic acid, iodic acid, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, 1,4-benzoquinone, toluquinone, dimethyl-1,4-benzoquinone, chloranil, alloxan, N-methylmorpholine N-oxide (NMMO), trimethylamine N-oxide, pyridine-N-oxide, t-butyl-hydroperoxide, and combinations thereof. Preferably, the oxidizing agents that are weaker oxidants than hydrogen peroxide include NMMO, ammonium persulfate, pyridine-N-oxide, tert-butyl-hydroperoxide, and combinations thereof.

The at least one metal corrosion inhibitors are defined hereinabove in the first aspect of the invention.

The compositions of the second aspect are formulated in parts or weight percent ratios whereby the wt % of base:wt % of oxidizing agent:wt % of water is 0.01-10:0.01-10:4-3000, preferably 0.5-1.5:0.5-1.5:4-400, and most preferably 1:1:6-300. It should be appreciated that the liquid compositions can be made as a concentrate and diluted with additional water at the fab just prior to use. For example, the liquid compositions can be mixed to have a 1:1:5 base:oxidizing agent:water ratio and mixed with additional water at the fab to yield a 1:1:300 base:oxidizing agent:water ratio for cleaning. When corrosion inhibitor(s) are present, the wt % of base:wt % of oxidizing agent:wt % of corrosion inhibitor:wt % of water is 0.01-10:0.01-10:0.01-10:4-3000, more preferably 0.5-1.5:0.5-1.5:0.5-1.5:4-400, and most preferably 1:1:1:6-300. It should be appreciated that the liquid compositions can be made as a concentrate and diluted with additional water at the fab just prior to use.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Accordingly, a third aspect relates to a kit including, in one or more containers, one or more components adapted to form the compositions described herein. The containers of the kit must be suitable for storing and shipping said liquid composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a fourth aspect, the invention relates to methods of cleaning the surface of a III-V material using one of the liquid compositions described herein. For example, post-ash residue and other contaminants may be removed without substantially damaging the III-V material, most preferably with negligible re-plating. For example, the III-V material can comprise InGaAs.

In cleaning applications, the liquid composition is applied in any suitable manner to the surface of the microelectronic device having the III-V material thereon, e.g., by spraying the liquid composition on the surface of the device, by dipping (in a static or dynamic volume of the liquid composition) of the device including the III-V material, by contacting the device with another material, e.g., a pad, or fibrous sorbent applicator element, that has the liquid composition absorbed thereon, by contacting the device including the III-V material with a circulating liquid composition, or by any other suitable means, manner or technique, by which the liquid composition is brought into contact with the III-V material. The application may be in a batch or single wafer apparatus, for dynamic or static cleaning. Advantageously, the liquid composition described herein cleans the III-V material of post-ash residue and other contaminants in a highly efficient and highly selective manner without substantially removing the III-V material.

In use of the liquid compositions for cleaning the III-V materials, the liquid composition typically is contacted with the device structure in a tool for a sufficient time of from about 0.3 minute to about 30 minutes, preferably about 1 minute to about 10 minutes, at temperature in a range of from about 20° C. to about 100° C., preferably about 20° C. to about 60° C. Such contacting times and temperatures are illustrative, and any other suitable time and temperature conditions may be employed that are efficacious to at least partially clean the device structure comprising the III-V material without substantially removing the III-V material. The method can be practiced in a single wafer or a multi-wafer tool.

Following the achievement of the desired etching action, the composition can be readily removed from the microelectronic device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

A fifth aspect of the invention relates to the improved microelectronic devices made according to the methods described herein and to products containing such microelectronic devices.

A sixth aspect relates to methods of manufacturing an article comprising a microelectronic device, said method comprising contacting the microelectronic device with a liquid composition for sufficient time to clean III-V material present on the microelectronic device, and incorporating said microelectronic device into said article, wherein the composition is either the composition of the first aspect or the second aspect, as described herein.

A seventh aspect of the invention relates to an article of manufacture comprising, consisting of or consisting essentially of a microelectronic device substrate comprising a surface of III-V material, and a liquid composition as described herein.

The features and advantages of the invention are more fully shown by the illustrative examples discussed below.

EXAMPLE 1

The etch rate of InGaAs was tested using modified SC2 formulations. The InGaAs coupons were pretreated by immersion in acetone/IPA for 10 min, followed by immersion in 10% HCl for 10 min, followed by immersion in each of formulations A-D for 5 min at room temperature.

TABLE 1

Improved SC2 formulations. Each contained 1:1:300 HCl:oxidizing agent:water unless indicated otherwise.

| Formulation | oxidizing agent | etch rate/Å min$^{-1}$ | E °/V |
|---|---|---|---|
| A | $H_2O_2$ | 147 | 1.78 |
| B | peroxyacetic acid | 101.206 | 1.76 |
| C | conc. nitric acid | 2.68 | 0.95 |
| D | perchloric acid | 2.006 | 1.37 |
| E | 50% NMMO (1:2:300) | 1.085 | |
| F | ammonium persulfate | 3.879 | |
| G | pyridine-N-oxide | 1.225 | |

It can be seen that the use of the oxidants weaker than hydrogen peroxide resulted in a much lower InGaAs etch rate.

EXAMPLE 2

The etch rate of InGaAs was tested using modified SC2 formulations. The InGaAs coupons were pretreated by immersion in acetone/IPA for 10 min, followed by immersion in 10% HCL for 10 min, followed by immersion in each of formulations A and H-X at room temperature.

TABLE 2

Improved SC2 formulations. Each contained 1:1:300 HCl:$H_2O_2$:water plus corrosion inhibitor

| Formulation | corrosion inhibitor | Conc. corrosion inhibitor | etch rate/Å min$^{-1}$ |
|---|---|---|---|
| A | — | | >50 |
| H | 1,2,4-triazole | 10% | 6.021 |
| I | 1,2,4-triazole | 10% | 7.553 |
| J | imidazole | 10% | 3.971 |
| K | DTT | 10% | 1.702 |
| L | di-n-propyldisulfide | 10% | 0.847 |
| M | cystaminum dichloride | 10% | 8.418 |
| N | 2,2'-thiodiacetic acid | 1.5% | 1.96 |
| O | 3,3'-thiodipropionic acid | 1.5% | 3.17 |
| P | thioglycolic acid | 1.0% | 1.65 |
| Q | dithiodiglycolic acid | 1.5% | 2.871 |
| R | 2,2'-(ethylenedithio)diacetic acid | 1.5% | 2.31 |
| S | ethyl 2-mercaptoacetate | 1.0% | 2.136 |
| T | 3-methoxybutyl thioglycolate | 1.5% | 1.908 |
| U | methyl thioglycolate | 1.0% | 1.638 |
| V | dodecylphosphonic acid | 1.0% | 0.56 |
| W | benzylphosphonic acid | 1.5% | 4.248 |
| X | phenylphosphonic acid | 1.5% | 1.916 |

It can be seen that compounds that contain —N, —P or —S could act as III-V material inhibitors and effectively reduce the InGaAs etch rate.

EXAMPLE 3

The etch rate of InGaAs was tested using modified SC1 formulations. The InGaAs coupons were pretreated by immersion in acetone/IPA for 10 min, followed by immersion in 10% HCl for 10 min, followed by immersion in each of formulations AA-DD at room temperature.

TABLE 3

Improved SC1 formulations. Each contained 1:1:300 $NH_4OH$:oxidizing agent:water unless indicated otherwise.

| Formulation | oxidizing agent | etch rate/Å min$^{-1}$ |
|---|---|---|
| AA | 50% NMMO (1:2:300) | 1.556 |
| BB | ammonium persulfate | 6.451 |
| CC | pyridine-N-oxide | 3.229 |
| DD | t-butyl-hydroperoxide | 2.871 |

It can be seen that the use of the oxidants weaker than hydrogen peroxide resulted in a much lower InGaAs etch rate.

EXAMPLE 4

The etch rate of InGaAs was tested using modified SC1 formulations. The InGaAs coupons were pretreated by immersion in acetone/IPA for 10 min, followed by immersion in 10% HCl for 10 min, followed by immersion in each of formulations EE-LL at room temperature.

TABLE 4

Improved SC1 formulations. Each contained 1:1:10 base:H$_2$O$_2$:water unless indicated otherwise.

| Formulation | base | etch rate/Å min$^{-1}$ |
|---|---|---|
| EE | triethanolamine | 1.556 |
| FF | 25% TMAH | 6.451 |
| GG | hydroxylamine | 3.229 |
| HH | 40% BTMAH | 2.871 |
| II | 2-(2-aminoethoxy)ethanol | 2.115 |
| JJ | 40% TBAH | 0.799 |
| KK | 1:1:5 40% TBAH | 2.232 |
| LL | 40% TEAH | 0.061 |
|  | 1:1:5 40% TEAH | 2.245 |
| MM | 40% TPAH | 2.167 |
|  | 1:1:5 40% TPAH | 2.42 |

It can be seen that the use of the bases other than ammonium hydroxide even though much more concentrated relative to formulation A in Examples 1 and 2 resulted in a much lower InGaAs etch rate.

EXAMPLE 5

InGaAs coupons were cleaned with HCl to remove native oxides, followed by a 20 minute immersion in 10 wt % BTA in ethanol or 1.5 wt % 3,3'-thiodipropionic acid in water. Thereafter, the coupons were removed and rinsed and X-ray Photoelectron Spectroscopy (XPS) of the coupons at 0 hr and 24 hr post-immersion in the metal corrosion inhibitors was performed. It was determined that the even 24 hours post-immersion, the coupon having exposure to the 3,3'-thiodipropionic acid still substantially suppressed the formation of the oxide on the surface.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A liquid composition for cleaning the surface of a III-V microelectronic device material, said composition comprising at least one acid, at least one oxidizing agent, at least one corrosion inhibitor, and water, wherein the at least one corrosion inhibitor comprises a species selected from the group consisting of 5-methyl-benzotriazole, 4-phenyl-1,2,3-triazole, 5-mercapto-4H-[1,2,4]triazol-3-ol, 4-ethyl-5-mercapto-4H-1,2,4-triazol-3-ol, 4-ethyl-4H-1,2,4-triazol-3-thiol, 5-ethyl-4H-1,2,4-triazol-3-thiol, (3-mercapto-5-propyl-4H-1,2,4-triazol-4-yl)acetic acid, 4-(5-sulfanyl-1H-tetraazol-1-yl)benzoic acid, pentylenetetrazole, 5-phenyl-1H-tetrazole, 5-benzyl-1H-tetrazole, 2-benzylpyridine, succinimide, adenosine, carbazole, saccharin, benzoin oxime, DL-dithiothreitol (DTT), cystaminum dichloride, di-n-propyldisulfide, ammonium sulfide, ethyl thioglycolate, 2-mercaptoethanol, 1,2-ethanedithiol, cysteine, methionine, dibenzothiophene, S-adenosylmethionine, taurine, glutathione, thiolactic acid, mercaptosuccinic acid, thiosalicylic acid, 4-mercaptobenzoic acid, 2,2'-thiodiacetic acid, 3,3'-thiodipropionic acid, thioglycolic acid, dithiodiglycolic acid, 2,2'-(ethylenedithio)diacetic acid, ethyl 2-mercaptoacetate, 3-methoxybutyl thioglycolate, methyl thioglycolate, dodecylphosphonic acid (DDPA), benzylphosphonic acid, phenylphosphonic acid, and combinations thereof, wherein the at least one acid comprises hydrochloric acid.

2. The liquid composition of claim 1, wherein the at least one oxidizing agent comprises a species selected from the group consisting of hydrogen peroxide, nitric acid, perchloric acid, peroxyacetic acid, FeCl$_3$, oxone, periodic acid, iodic acid, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, sodium persulfate, sodium hypochlorite, potassium iodate, potassium peimanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, 1,4-benzoquinone, toluquinone, dimethyl-1,4-benzoquinone, chloranil, alloxan, N-methylmotpholine N-oxide, trimethylamine N-oxide, pyridine-N-oxide, t-butyl-hydroperoxide, and combinations thereof.

3. The liquid composition of claim 1, wherein the pH is in a range from about 0 to about 4.

4. The liquid composition of claim 1, wherein the liquid composition is substantially devoid of fluoride sources.

5. The liquid composition of claim 1, wherein the at least one corrosion inhibitor comprises a species selected from the group consisting of 2,2'-thiodiacetic acid, 3,3'-thiodipropionic acid, thioglycolic acid, dithiodiglycolic acid, 2,2'-(ethylenedithio)diacetic acid, ethyl 2-mercaptoacetate, 3-methoxybutyl thioglycolate, methyl thioglycolate, benzylphosphonic acid, phenylphosphonic acid, and combinations thereof.

6. A liquid composition for cleaning the surface of a III-V microelectronic device material, said composition comprising at least one base, at least one oxidizing agent, and water, with the proviso that (a) the at least one oxidizing agent comprises an oxidant that is milder than hydrogen peroxide, (b) the liquid composition comprises a base other than ammonium hydroxide, or (c) both (a) and (b), wherein the pH of the liquid composition is in a range from about 9 to about 14.

7. The liquid composition of claim 6, wherein the liquid composition is substantially devoid of hydrogen peroxide and the at least one oxidizing agent that is milder than hydrogen peroxide comprises a species selected from the group consisting of nitric acid, perchloric acid, peroxyacetic acid, FeCl$_3$, oxone, periodic acid, iodic acid, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, 1,4-benzoquinone, toluquinone, dimethyl-1,4-benzoquinone, chloranil, alloxan, N-methylmorpholine N-oxide, trimethylamine N-oxide, pyridine-N-oxide, t-butyl-hydroperoxide, and combinations thereof.

8. The liquid composition of claim 7, wherein the at least one base is not ammonium hydroxide.

9. The liquid composition of claim 8, wherein the at least one base comprises a species selected from the group consisting of monoethanolamine (MEA), diethanolamine, triethanolamine, dimethylaminoethanol, diethylaminoethanol, 2-amino-2-methyl-1-propanol, N-(aminoethyl)ethanolamine, N,N-dimethyl-2-aminoethanol, 2-(2-aminoethoxy)ethanol, tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), hydroxyamine, trimethylethylammonium hydroxide, diethyldimethylammonium hydroxide, choline hydroxide, tetrabutylphosphonium hydroxide, guanidine acetate, 1,1,3,3-tetramethylguanidine, guanidine carbonate, arginine, and combinations thereof.

10. The liquid composition of claim 6, wherein the at least one oxidizing agent comprises hydrogen peroxide and the at least one base comprises a species selected from the group consisting of monoethanolamine (MEA), diethanolamine, triethanolamine, dimethylaminoethanol, diethylaminoethanol, 2-amino-2-methyl-1-propanol, N-(aminoethyl)ethanolamine, N,N-dimethyl-2-aminoethanol, 2-(2-aminoethoxy)ethanol, tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), hydroxyamine, trimethylethylammonium hydroxide, diethyldimethylammonium hydroxide, choline hydroxide, tetrabutylphosphonium hydroxide, guanidine acetate, 1,1,3,3-tetramethylguanidine, guanidine carbonate, arginine, and combinations thereof.

11. The liquid composition of claim 6, wherein the composition further comprises at least one corrosion inhibitor.

12. A method of cleaning a surface of a III-V microelectronic device material, said method comprising contacting the surface with a liquid composition of claim 1 at time and temperature to at least partially clean the device structure comprising the III-V material without substantially removing the III-V material.

13. The method of claim 12, wherein the III-V microelectronic device material comprises a species selected from the group consisting of InP, InAs, GaAs, AsP, InGaAs, InGaAsP, GaP, GaSb, InSb, AlAs, AlGaAs, InAlAs, InAlGaAs, InAlGaP, and InGaP.

14. The method of claim 12, wherein residue and contaminants are cleaned from the surface of the III-V microelectronic device material without substantial removal of the III-V material of a substantial change in the stoichiometry of the III-V material.

15. A method of cleaning a surface of a III-V microelectronic device material, said method comprising contacting the surface with a liquid composition of claim 6 at time and temperature to at least partially clean the device structure comprising the III-V material without substantially removing the III-V material.

16. The method of claim 15, wherein the III-V microelectronic device material comprises a species selected from the group consisting of InP, InAs, GaAs, AsP, InGaAs, InGaAsP, GaP, GaSb, InSb, AlAs, AlGaAs, InAlAs, InAlGaAs, InAlGaP, and InGaP.

17. The method of claim 15, wherein residue and contaminants are cleaned from the surface of the III-V microelectronic device material without substantial removal of the III-V material of a substantial change in the stoichiometry of the III-V material.

18. The liquid composition of claim 1, wherein the at least one oxidizing agent comprises a species selected from the group consisting of hydrogen peroxide, nitric acid, perchloric acid, peracetic acid, and combinations thereof.

19. A liquid composition for cleaning the surface of a III-V microelectronic device material, said composition comprising at least one acid, at least one oxidizing agent, at least one corrosion inhibitor, and water, wherein the at least one corrosion inhibitor comprises a species selected from the group consisting of 5-methyl-benzotriazole, 4-phenyl-1,2,3-triazole, 5-mercapto-4H-[1,2,4]triazol-3-ol, 4-ethyl-5-mercapto-4H-1,2,4-triazol-3-ol, 4-ethyl-4H-1,2,4-triazol-3-thiol, 5-ethyl-4H-1,2,4-triazol-3-thiol, (3-mercapto-5-propyl-4H-1,2,4-triazol-4-yl)acetic acid, 4-(5-sulfanyl-1H-tetraazol-1-yl)benzoic acid, pentylenetetrazole, 5-phenyl-1H-tetrazole, 5-benzyl-1H-tetrazole, 2-benzylpyridine, succinimide, adenosine, carbazole, saccharin, benzoin oxime, DL-dithiothreitol (DTT), cystaminum dichloride, di-n-propyldisulfide, ammonium sulfide, ethyl thioglycolate, 2-mercaptoethanol, 1,2-ethanedithiol, cysteine, methionine, dibenzothiophene, S-adenosylmethionine, taurine, glutathione, thiolactic acid, mercaptosuccinic acid, thiosalicylic acid, 4-mercaptobenzoic acid, 2,2'-thiodiacetic acid, 3,3'-thiodipropionic acid, thioglycolic acid, dithiodiglycolic acid, 2,2'-(ethylenedithio)diacetic acid, ethyl 2-mercaptoacetate, 3-methoxybutyl thioglycolate, methyl thioglycolate, dodecylphosphonic acid (DDPA), benzylphosphonic acid, phenylphosphonic acid, and combinations thereof, wherein the pH is in a range from about 0 to about 4.

* * * * *